(12) United States Patent
Peytavy et al.

(10) Patent No.: US 7,812,428 B2
(45) Date of Patent: Oct. 12, 2010

(54) SECURE CONNECTOR GRID ARRAY PACKAGE

(75) Inventors: Alain Peytavy, Aix en Provence (FR); Alexandre Croguennec, Aix en Provence (FR)

(73) Assignee: Atmel Rousset S.A.S., Rousset (FR)

( * ) Notice: Subject to any disclaimer, the term of this patent is extended or adjusted under 35 U.S.C. 154(b) by 309 days.

(21) Appl. No.: 11/951,111

(22) Filed: Dec. 5, 2007

(65) Prior Publication Data

US 2009/0146267 A1    Jun. 11, 2009

(51) Int. Cl.
*H01L 23/552* (2006.01)
*H01L 23/02* (2006.01)

(52) U.S. Cl. ............... 257/659; 257/922; 257/780; 257/679; 257/E23.021

(58) Field of Classification Search ........ 257/922, 257/679, 659, 686, E23.021, 780
See application file for complete search history.

(56) References Cited

U.S. PATENT DOCUMENTS

| | | | |
|---|---|---|---|
| 4,593,384 A | 6/1986 | Kleijne | |
| 4,691,350 A | 9/1987 | Kleijne et al. | |
| 4,774,633 A | 9/1988 | Dehaine et al. | |
| 4,807,284 A | 2/1989 | Kleijne | |
| 5,072,331 A * | 12/1991 | Thiele et al. | 361/767 |
| 5,406,630 A | 4/1995 | Piosenka et al. | |
| 5,861,662 A | 1/1999 | Candelore | |
| 5,877,547 A | 3/1999 | Rhelimi | |
| 5,998,858 A * | 12/1999 | Little et al. | 257/678 |
| 6,268,649 B1 | 7/2001 | Corisis et al. | |
| 6,396,400 B1 | 5/2002 | Epstein, III et al. | |
| 6,414,884 B1 * | 7/2002 | DeFelice et al. | 365/195 |
| 6,420,789 B1 | 7/2002 | Tay et al. | |
| 6,646,565 B1 * | 11/2003 | Fu et al. | 340/687 |
| 6,818,978 B1 | 11/2004 | Fan | |
| 6,853,093 B2 * | 2/2005 | Cohen et al. | 257/678 |
| 6,906,416 B2 | 6/2005 | Karnezos | |
| 6,947,295 B2 | 9/2005 | Hsieh | |
| 7,054,162 B2 * | 5/2006 | Benson et al. | 361/760 |
| 7,166,494 B2 | 1/2007 | Karnezos | |
| 7,180,008 B2 | 2/2007 | Heitmann et al. | |
| 7,586,186 B2 * | 9/2009 | Honda | 257/691 |
| 2003/0014728 A1 | 1/2003 | Shaeffer et al. | |
| 2004/0231872 A1 * | 11/2004 | Arnold et al. | 174/35 R |
| 2005/0035452 A1 * | 2/2005 | Zhang et al. | 257/738 |
| 2007/0018334 A1 | 1/2007 | Peytavy et al. | |
| 2007/0038865 A1 | 2/2007 | Oggioni et al. | |
| 2007/0177363 A1 | 8/2007 | Jayanetti | |
| 2008/0251905 A1 * | 10/2008 | Pope et al. | 257/679 |

OTHER PUBLICATIONS

Atmel Corporation, International Search Report and the Written Opinion for PCT/US2008/085413 mailed Feb. 4, 2009, 11 pages.
Result of the prior art search performed Oct. 11, 2007, 9 pages.

* cited by examiner

*Primary Examiner*—Nitin Parekh
(74) *Attorney, Agent, or Firm*—Fish & Richardson P.C.

(57) ABSTRACT

Methods, systems, IC packages, and electrical devices for providing data security for ICs. A substrate-on-substrate connector grid array package with an electrical shield can protect sensitive information in a secure IC from being accessed by physical attacks. A current flow in the electrical shield can be monitored for disturbances which can indicate an attack on the IC package.

14 Claims, 4 Drawing Sheets

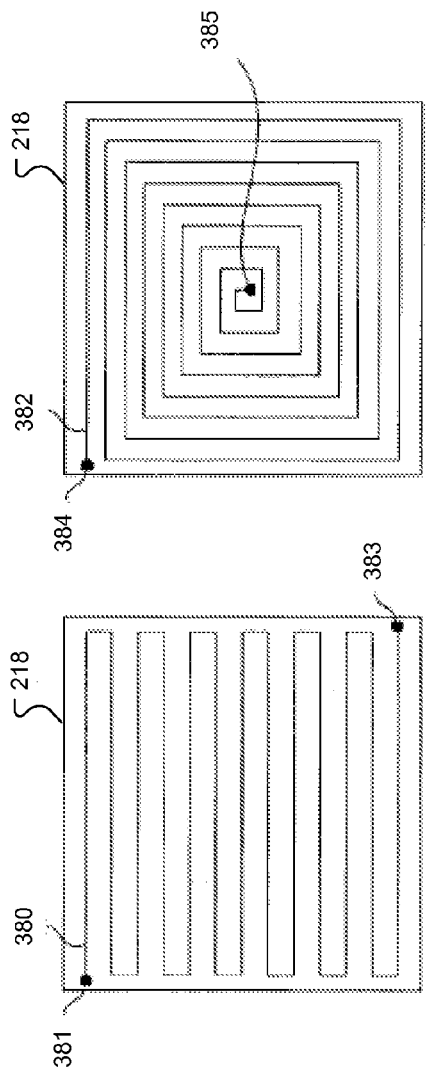
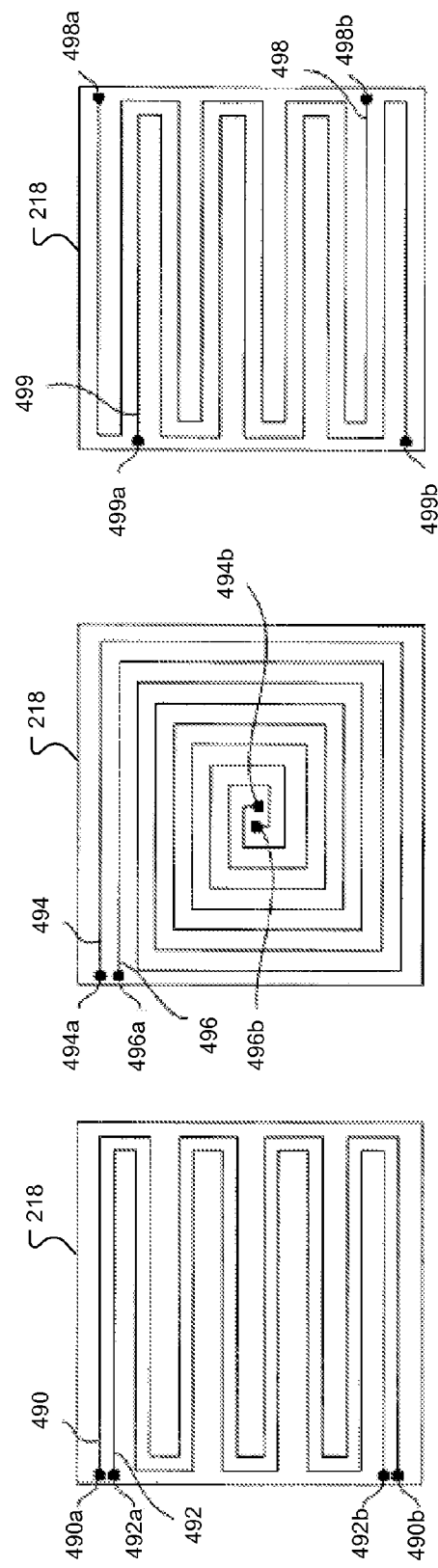
FIG. 3A
FIG. 3B
FIG. 4A
FIG. 4B
FIG. 4C

US 7,812,428 B2

SECURE CONNECTOR GRID ARRAY PACKAGE

TECHNICAL FIELD

The subject matter of this patent application is generally related to packaged integrated circuits.

BACKGROUND

Secure integrated circuits (ICs) are widely used in secure systems. Some example secure systems are banking payment terminals, personal identification number (PIN) entry devices, smartcard readers, and security tokens. Often, sensitive information (e.g., PINs to banking accounts, social security numbers, or cryptographic keys) is stored and/or manipulated in the secure ICs. This sensitive information needs to be protected against attackers who attempt to access the information by physically breaking through the packaging of secure ICs by chemical or other means.

To protect sensitive information, some conventional secure ICs are included in ball grid array (BGA) packages, which have ball connectors located under the packages. The ability of a hacker to physically probe an IC package can be reduced by using ball connectors instead of conventional IC pins, because the ball connectors are not located on the edge of the package and thus cannot be probed as easily as IC pins. A plastic cap located on top of the IC package can help prevent a hacker from probing from the top of the IC package. However, in some scenarios, the plastic cap can be opened by chemical means, allowing secure information to be accessed by probing bonding wires or by manipulating a physical surface of a semiconductor die exposed after a portion of the plastic cap has been removed.

SUMMARY

Methods, systems, IC packages, and electrical devices for providing data security for ICs are described. A substrate-on-substrate connector grid array package with an electrical shield can protect sensitive information in a secure IC from being accessed by physical attacks. A current flow in the electrical shield can be monitored for disturbances which can indicate an attack on the IC package.

Particular embodiments of the subject matter described in this specification can be implemented to realize one or more of the following advantages. For an IC package containing a single IC, the size of the IC package can be just slightly larger than the size of the IC alone. Upon detection of an intrusion of the IC package, sensitive data stored in the IC package can be protected from access by the intruder, for example, by erasing the sensitive data or by halting the exchange of the sensitive data between the IC package and the other components of an electrical device.

DESCRIPTION OF DRAWINGS

FIGS. 3A-3B are top views of example electrical shields with single traces having two grid array connector contacts.

FIGS. 4A-4C are top views of example electrical shields with double traces, each trace having two grid array connector contacts.

DETAILED DESCRIPTION

Example Payment System

Figure 1:
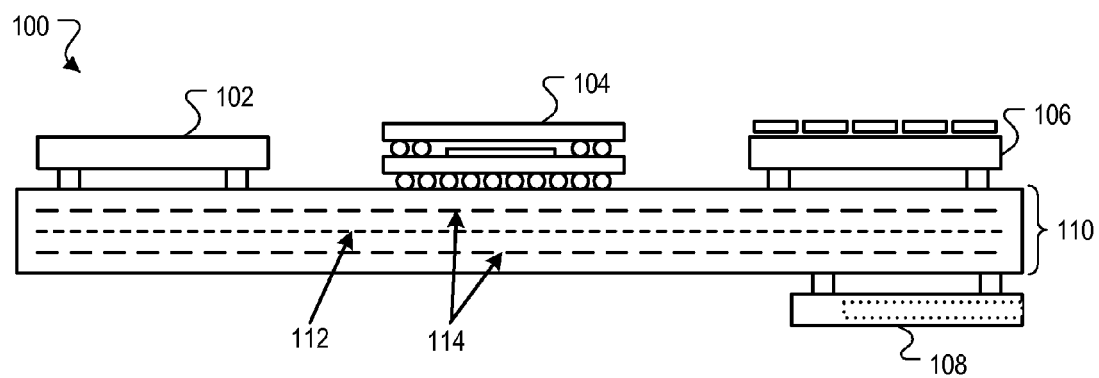
FIG. 1 shows a cross-sectional view of an example payment system having at least one securely packaged IC.

FIG. 1 shows a cross-sectional view of an example payment system 100 having at least one securely packaged IC. For example, the payment system 100 can be a banking payment terminal or an automatic teller machine (ATM). As shown, the payment system 100 includes a display 102 (e.g., a liquid crystal display (LCD) display), a central IC 104, a keypad 106, and a smartcard reader 108. In some implementations, the components of the payment system 100 are covered or encased in a housing (not shown), which provides a first level of physical protection for the components.

The display 102, the central IC 104, the keypad 106, and the smartcard reader 108 are mounted (e.g., soldered) on a printed circuit board (PCB) 110. In some implementations, the PCB 110 may also include a battery back-up storage area (e.g., a static random access memory (SRAM) IC) that stores secure information (e.g., secret keys for encryption). In some implementations, the secure information may be erased if the battery is electrically disconnected from the storage area.

In some scenarios, sensitive information (e.g., a PIN of a customer using the payment system 100) may be exchanged between the display 102, the central IC 104, the keypad 106, and the smartcard reader 108. In the present example, the PCB 110 includes a secure routing layer 112 for transferring sensitive information. The secure routing layer 112 can be located in an inner layer of the PCB 110 to protect the sensitive information. An attacker of the payment system 100 may need to break through external layers of the PCB 110 to access sensitive information transmitted in the secure routing layer 112.

In the depicted example, the PCB 110 includes mesh lines 114 on the external layers of the PCB 110. In some implementations, the mesh lines 114 can be used as a security component to detect physical tampering of the payment system 100. In some implementations, a physical attack on the PCB 110 (e.g., by physically opening the external layers of the PCB 110 to access the secure routing layer 112) may change a layout of one or more of the mesh lines 114 so that an open-circuit or a short-circuit is created in one or more of the mesh lines 114. In one implementation, the central IC 104 can monitor the mesh lines 114 to detect a new open-circuit or short-circuit. For example, the central IC 104 can perform secure operations to protect the sensitive information transferred in the secure routing layer 112 upon detecting a tampering event (e.g., indicated by a new open-circuit or short-circuit in the mesh lines 114). In one example, the central IC 104 can stop the data transfer in the secure routing layer 112 if a tampering event is detected. Thus, the mesh lines 114 can protect the sensitive information transferred in the secure routing layer 112 of the PCB 110.

The central IC 104 can include one or more semiconductor dies to control external security components, such as a monitoring component for monitoring open-circuits and short-circuits in the mesh lines 114 of the payment system 100. In some examples, the security components may also include switches on an external housing (not shown) of the payment system 100 for detecting breaches in the external housing.

As shown in FIG. 1, the central IC 104 has a substrate-on-substrate BGA package to prevent hackers from compromising the central IC 104. An example structure of the substrate-on-substrate BGA package is described below.

Substrate-on-Substrate BGA IC Package

Figure 2:
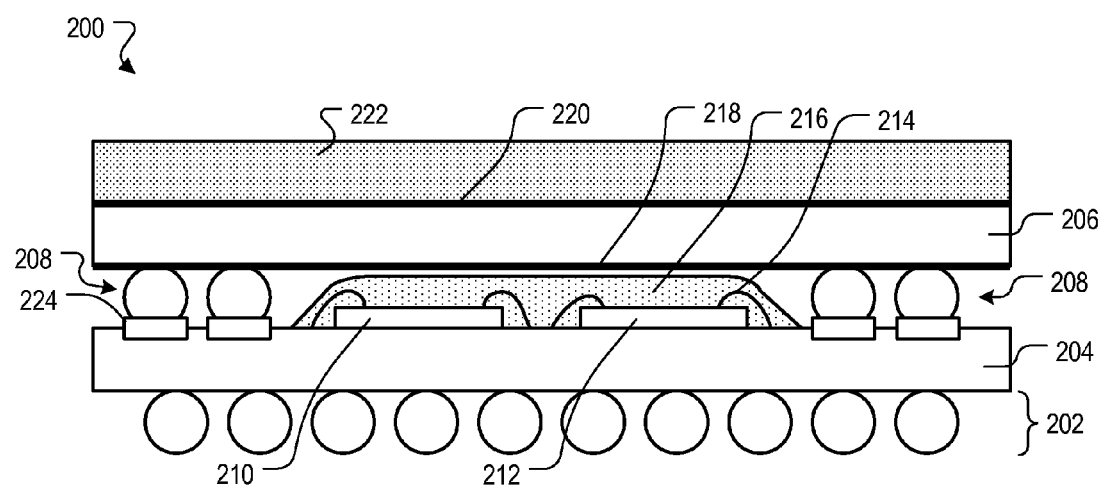
FIG. 2 shows an example secure substrate-on-substrate BGA IC package.

FIG. 2 shows an example structure of a secure substrate-on-substrate BGA IC package 200. The IC package 200 can be, for example, the packaged central IC 104 included in the payment system 100 of FIG. 1. In this example, the IC package 200 includes a first BGA 202 and a first substrate 204. The IC package 200 can be mounted on a PCB (e.g., the PCB 110 of FIG. 1) and electrically connected or coupled to the PCB through the BGA 202. As used herein, the terms "connected" or "connection" means a physical connection or a coupling of electromagnetic, optical, or other similar form. In some implementations, at least some of the ball connectors in the BGA 202 are soldered to the PCB. In some implementations, a different type of contact array is used, e.g., a column grid array.

The IC package 200 also includes a second substrate 206 coupled to the first substrate 204 by ball connectors, which form a second BGA 208. In some implementations, the second substrate 206 is mounted on the first substrate 204 through a contact array, where the contact array is coupled to a surface (e.g., a top surface) of the first substrate 204 and includes a number of electrically conductive mounting structures. As shown in FIG. 2, the first substrate 204 hosts two semiconductor dies 210, 212 (e.g., ICs). In other examples, the first substrate 204 can host a single semiconductor die or more than two semiconductor dies. The dies 210, 212 are mounted to a surface of the first substrate 204, located between the first and the second substrates 204, 206, and at least partially surrounded by at least some of the ball connectors of the BGA 208. Likewise, if a contact array of electrically conductive mounting structures is used, the dies 210, 212 are at least partially surrounded by at least some of the electrically conductive mounting structures. The IC package 200 includes bonding wires 214 to connect electrical pads (not shown) on the surface of the semiconductor dies 210, 212 to metallization lines (not shown) on the substrate 204. For example, the semiconductor dies 210, 212 can transmit signals to and receive signals from the first substrate 204 through the bonding wires 214. From the first substrate 204, the signals can be transmitted to the PCB to which the IC package 200 is connected by way of the BGA 202. In this example, the semiconductor dies 210, 212 and the bonding wires 214 are housed in an epoxy globtop 216. The epoxy globtop 216 can protect the semiconductor dies 210, 212 from mechanical damage and contamination.

FIG. 2 shows the BGA 208 as a double row of ball connectors surrounding the semiconductor dies 210, 212 on four sides. In other examples, the BGA 208 of the IC package 200 can be implemented as a single row of ball connectors or more than two rows of ball connectors. When the BGA 208 includes multiple rows of ball connectors, sensitive information can be routed through the ball connectors of the inner rows, while non-sensitive information can be routed through the ball connectors of the outer rows. The ball connectors of a row can be aligned or offset with respect to the ball connectors of adjacent rows.

The second substrate 206 includes an electrical shield 218. The second substrate 206 can include a ground plate 220 and a plastic cap 222 to protect the IC package 200. As shown, the ground plate 220 and the plastic cap 222 are located on top of the second substrate 206. The electrical shield 218 is coupled to a surface (e.g., a bottom surface) of the second substrate 206. In some implementations, the electrical shield 218 includes one or more serpentine or spiral traces that conduct electric current. The electrically conductive traces in the electrical shield 218 can be connected to the semiconductor dies 210, 212 through the BGA 208 and the first substrate 204.

In some implementations, the ground plate 220 is a metal plate that is connected to an electrical ground of the IC package 200. In some implementations, the ground plate 220 can filter some electromagnetic emissions of the semiconductor dies 210, 212 and provide data security against various types of attacks (e.g., side channel attacks). In some implementations, the electrical shield 218 can be electrically coupled to the ground plate 220. In other implementations, the ground plate 220 is optional and can be replaced by another layer of the electrical shield 218.

In the depicted example, the substrates 204, 206 are connected by the BGA 208 and metal landing areas 224. The metal landing areas 224 are located on the upper surface of the first substrate 204 to create an electrical connection between the first substrate 204 and the ball connectors of the BGA 208.

In some implementations, the semiconductor dies 210, 212 receive electrical signals from the electrical shield 218 indicating whether the IC package 200 is being attacked. The electrical shield 218 can be connected to a current source (not shown). In one example, a current from a current source (e.g., a battery) can be introduced through the electrical shield 218 and monitored for a disturbance. The electrical shield 218 can include traces (e.g., serpentine traces) to carry the introduced current. By detecting a disturbance in the introduced current (e.g., a short-circuit or an open-circuit), the IC package 200 can determine whether it is under attack. In some implementations, one or both of the semiconductor dies 210, 212 are operable to detect a disturbance in a current flow in the electrical shield 218. In some implementations, one or both of the semiconductor dies 210, 212 can include an electronic device that can detect a current disturbance by monitoring electrical signals received from the electrical shield 218 through the BGA 208, the metal landing areas 224, and the first substrate 204.

In some implementations, one or both of the semiconductor dies 210, 212 can include a current sensing device or a security circuit connected to the electrical shield 218. In other implementations, other tampering indicators (e.g., a voltage drop within the electrical shield 218) may be detected. Upon detecting a disturbance, the semiconductor dies 210, 212 can perform secure operations to protect sensitive data in the IC package 200 or in a secure system to which the IC package 200 is connected. In some implementations, a transmission of signals carrying sensitive data between the IC package 200 and the PCB or another IC/component mounted on the PCB is halted or aborted. In some implementations, the IC package 200 can also protect a secure system, e.g., the payment system 100 of FIG. 1, by transmitting an instruction to the PCB 110 to stop transmission of data between the display 102, the central IC 104, the keypad 106, and/or the smartcard reader 108. In some implementations, sensitive data stored in the IC package 200 or stored elsewhere (e.g., in a SRAM connected to the IC package 200 through a PCB) can be erased. In some implementations, the IC package 200 can remove power supply from the secure system (e.g., the payment system 100 of FIG. 1) by, for example, disconnecting the battery power source from the secure system. In some scenarios, sensitive data stored in volatile memory can be substantially removed (e.g., erased) from the secure system upon removal of the power source. In some implementations, the IC package 200 can perform secure operations including a combination of some or all of the above operations and other secure operations.

In some implementations, additional substrates can be added to the IC package 200. Each additional substrate can be mounted on either the first substrate or the second substrate. For example, an additional substrate can be added on top of the second substrate 206. The additional substrate can be mounted directly or indirectly through an additional BGA. In one example, the additional substrate can be electrically connected to the second substrate 206 through a third BGA. In some implementations, the second substrate or the third substrate can host one or more semiconductor dies that are at least partially surrounded by the third BGA.

In some implementations, the semiconductor die 210 or 212 can be mounted on the second substrate 206 instead of the first substrate 204. For example the semiconductor dies mounted on different substrates can split the security measures of the IC package 200. In some examples, a semiconductor die mounted on the first substrate can monitor an electrical shield on a second substrate, and a semiconductor die mounted on the second substrate can monitor an electrical shield on the first substrate. In various implementations, a first semiconductor die, upon detecting an intrusion in the substrate hosting a second semiconductor die, can disable the second semiconductor die in order to protect the integrity of the secure IC package 200.

In some implementations, the IC package 200 can include one or more additional ICs. For example, each additional IC can be adapted for mounting on either the first substrate 204 or the second substrate 206. In a variation of FIG. 2, additional semiconductor dies can be mounted on the first substrate 204 or the second substrate 206 and connected to the respective substrate by additional bonding wires 214.

In some implementations, the IC package 200 can include discrete elements which might otherwise be separately mounted on a PCB of a secure system. For example, including a battery and/or a resonator within the IC package 200 provides protection against physical attacks for these discrete elements. Furthermore, including discrete elements in the IC package 200 can simplify the manufacturing of the secure system.

In some implementations, the manufacturing of the IC package 200 can include an etch-back process, which removes through etching signaling along the edge of the substrate. This etching provides additional data security by inhibiting probing at the edge of the substrates of the IC package 200.

Example Electrical Shields

Various trace designs can be used in the electrical shield 218 to carry the monitoring current. FIGS. 3A-3B are top views of example electrical shields 218 with single traces 380, 382 having two grid array connector contacts. As shown in FIG. 3A, the example electrical shield 218 includes the serpentine single trace 380 that sweeps back and forth between opposing sides of the electrical shield 218. At the ends of the trace 380 are vias 381, 383 (e.g., ball connector contacts). Through the vias 381, 383 and the connectors of the grid array (e.g., ball connectors of the BGA 208) with which the vias 381, 383 are in contact, the trace 380 can be electrically connected to the first substrate 204. One or both of the semiconductor dies 210, 212 can monitor the current flow in the trace 380 through the vias 381, 383.

As shown in FIG. 3B, the example electrical shield 218 includes a single trace 382 with vias 484, 485 (e.g., ball connector contacts) at the end of the trace 382. The trace 382 has a spiral pattern with one end in one corner and another end near the center of the electrical shield 218. Other patterns for single traces are possible. Grid array connectors in contact with the vias of the electrical shield 218 can be located at a central location, at an edge location, or at a different location below the surface of the electrical shield 218.

FIGS. 4A-4C are top views of example electrical shields 218 with double traces, each trace having two grid array connector contacts. A physical attack on the IC package (e.g., IC package 200 of FIG. 2) can create an open-circuit or a short-circuit in either or both of the double traces. As shown in FIG. 4A, a first serpentine trace 490 terminates at two vias 490a, 490b (e.g., ball connector contacts). A second serpentine trace 492 terminates at vias 492a, 492b. Similarly, as shown in FIG. 4B, a first spiral trace 494 terminates at vias 494a, 494b, and a second spiral trace 496 terminates at vias 496a, 496b. As shown in FIG. 4C, a first serpentine trace 498 terminates at vias 498a, 498b, and a second serpentine trace 499 terminates at vias 499a, 499b. In each of the examples, each end of the intertwined traces, 490 and 492 of FIG. 4A, 494 and 496 of FIG. 4B, and 498 and 499 of FIG. 4C, can be connected through the vias 490a-b, 492a-b, 494a-b, 496a-b, 498a-b, and 499a-b, respectively, to grid array connectors (e.g., ball connectors of the BGA 208 of FIG. 2). Through the grid array connectors, the currents flowing through the double traces can be monitored by one or more semiconductor dies (e.g., the die 210 and/or the die 212) electrically coupled to the grid array connectors.

Although some implementations of the IC package 200 are described, other implementations are also possible. For example, although examples of electrical shields having one or two traces are described, electrical shields having other numbers of traces, such as three, four, eight, etc., traces, are within the scope of the subject matter described in this specification.

IC Package Monitor Process

Figure 5:
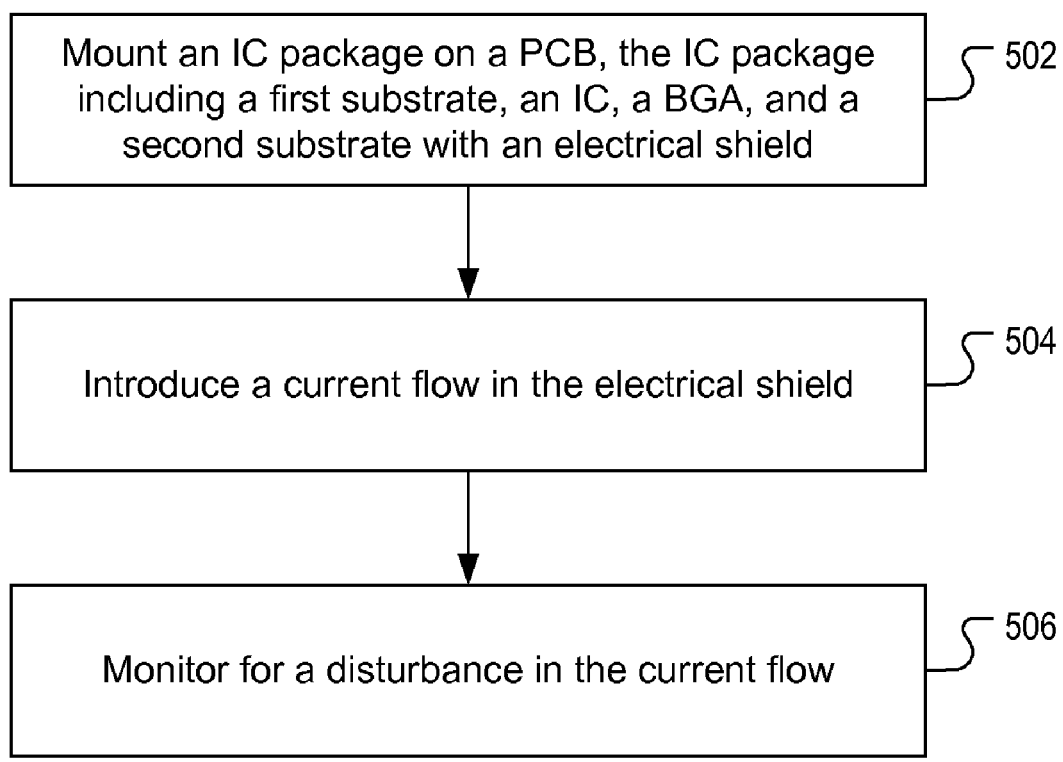
FIG. 5 illustrates an example process for monitoring an IC package for an attack.

FIG. 5 illustrates an example process 500 for monitoring an IC package for an attack. In some implementations, the process 500 can be used on the IC package 200 of FIG. 2.

An IC package is mounted on a printed circuit board (PCB) (502), where the IC package includes a first substrate, an IC, a BGA, and a second substrate with an electrical shield. The first substrate is electrically connected to the PCB, e.g., through a connector grid array. The IC is mounted on the first substrate and is electrically connected to the first substrate. The BGA surrounds the IC and is electrically connected to the IC through the first substrate. The electrical shield of the second substrate is electrically connected to the IC through the ball grid array and the first substrate.

A current flow is introduced in the electrical shield (504). In one example, the IC can control a current source to introduce the current flow in the electrical shield. The current flow in the electrical shield is monitored for a disturbance (506). In some implementations, the current can be monitored to detect a short-circuit or an open-circuit in one or more conductive traces (e.g., the traces of FIGS. 3A-3B and 4A-4C) of the electrical shield. A detected disturbance can indicate that the IC package is being physically attacked.

In some implementations, one or more operations can be performed upon detection of a disturbance to protect sensitive information in the IC package. For example, a transmission of signals (e.g., signals carrying sensitive data) between the IC package and the PCB or a component mounted on the PCB can be stopped. In another example, data stored in the IC package can be erased when a disturbance in the current is detected.

Particular embodiments of the subject matter described in this specification have been described. Other embodiments are within the scope of the following claims.

What is claimed is:

1. An integrated circuit package comprising:
a first substrate;
an integrated circuit mounted on a surface of the first substrate, the integrated circuit operable to be electrically connected to the first substrate;
a ball grid array disposed on the surface of the first substrate and at least partially surrounding the integrated circuit on the first substrate, the ball grid array electrically connected to the integrated circuit through the first substrate; and
a second substrate including an electrical shield, the electrical shield electrically connected to the integrated circuit through the ball grid array and the first substrate.

2. The integrated circuit package of claim 1, further comprising a security circuit operable to monitor for a disturbance in current flow in the electrical shield.

3. The integrated circuit package of claim 1, further comprising at least one discrete element mounted on either the first substrate or the second substrate, the at least one discrete element including a battery electrically connected to the electrical shield.

4. The integrated circuit package of claim 1, where the electrical shield is located on a second surface of the second substrate.

5. The integrated circuit package of claim 1, where the second substrate further includes an electromagnetic shield electrically connected to an electrical ground of the integrated circuit package.

6. The integrated circuit package of claim 1, where the electrical shield includes a conductive trace.

7. The integrated circuit package of claim 6, where the conductive trace is connected at each end to a ball connector in the ball grid array.

8. The integrated circuit package of claim 1, further comprising one or more additional substrates, where each additional substrate is mounted on either the first substrate or the second substrate directly or indirectly through an additional ball grid array.

9. An integrated circuit package comprising:
a first substrate;
a number of electrically conductive mounting structures coupled to a surface of the first substrate;
a semiconductor die mounted to the surface of the first substrate, so that the semiconductor die is at least partially surrounded by at least some of the electrically conductive mounting structures;
a second substrate mounted on the first substrate through the electrically conductive mounting structures; and
a number of electrically conductive traces coupled to a surface of the second substrate and electrically connected to the semiconductor die through the electrically conductive mounting structures and an electromagnetic shield coupled to a second surface of the second substrate and electrically connected to an electrical ground of the integrated circuit package.

10. The integrated circuit package of claim 9, where the electrically conductive mounting structures comprise a ball grid array.

11. The integrated circuit package of claim 9, where each electrically conductive trace is connected at each end to an electrically conductive mounting structure.

12. The integrated circuit package of claim 9, further comprising a third substrate mounted on either the first substrate or the second substrate directly or indirectly through a second number of electrically conductive mounting structures.

13. The integrated circuit package of claim 9, further comprising a security circuit operable to monitor for a disturbance in current flow in the electrically conductive traces.

14. The integrated circuit package of claim 9, where electrical signaling along edges of the first substrate or the second substrate has been removed through etching.

* * * * *